United States Patent
Micheloni et al.

(10) Patent No.: US 7,017,099 B2
(45) Date of Patent: Mar. 21, 2006

(54) METHOD FOR ERROR CONTROL IN MULTILEVEL CELLS WITH CONFIGURABLE NUMBER OF STORED BITS

(75) Inventors: Rino Micheloni, Turate (IT); Massimiliano Picca, Muggio' (IT); Roberto Ravasio, Carvico (IT); Stefano Zanardi, Seriate (IT)

(73) Assignee: STMicroelectronics S.r.l., Agrate Brianza (IL)

( * ) Notice: Subject to any disclaimer, the term of this patent is extended or adjusted under 35 U.S.C. 154(b) by 528 days.

(21) Appl. No.: 10/159,782

(22) Filed: May 30, 2002

(65) Prior Publication Data

US 2003/0018861 A1 Jan. 23, 2003

(30) Foreign Application Priority Data

Jun. 1, 2001 (IT) .......................... TO2001A0529

(51) Int. Cl.
*H03M 13/00* (2006.01)
(52) U.S. Cl. .................................................... 714/752
(58) Field of Classification Search ............... 714/720, 714/721, 723, 746, 755, 762, 756, 781, 752; 365/185.03
See application file for complete search history.

(56) References Cited

U.S. PATENT DOCUMENTS 5,754,566 A * 5/1998 Christopherson et al. ... 714/773
5,969,985 A * 10/1999 Tanaka et al. ......... 365/185.03

* cited by examiner

*Primary Examiner*—Albert Decady
*Assistant Examiner*—James C. Kerveros
(74) *Attorney, Agent, or Firm*—Lisa K. Jorgenson; Robert Iannucci; Seed IP Law Group PLLC

(57) ABSTRACT

A method for error control in multilevel memory cells storing a configurable number of bits. The error control is performed using an error-control code which operates, in the encoding phase, on b-bit binary strings made up of k symbols of r-bit data. When the memory cells store a number r of bits, a data symbol is formed only with the data bits stored in a memory cell. When the memory cells store a number s of bits smaller than r, a data symbol is formed with the data bits stored in a memory cell and with r-s bits having a pre-determined logic value, in which the data bits stored in the memory cell are arranged in the least significant part of the data symbol, and the r-s bits having a pre-determined logic value are arranged in the most significant part of the data symbol.

25 Claims, 3 Drawing Sheets

METHOD FOR ERROR CONTROL IN MULTILEVEL CELLS WITH CONFIGURABLE NUMBER OF STORED BITS

BACKGROUND OF THE INVENTION

1. Field of the Invention

The present invention relates to a method for error control in multilevel memory cells with a configurable number of stored bits.

2. Description of the Related Art

As is known, thanks to the evolution of technological processes, which makes it possible to provide elementary devices of ever smaller size, in the last few years semiconductor memories have been produced that have very high storage capacities.

A further increase in the storage capacity has be obtained by resorting to multilevel storage, which enables the storage density to be increased, given the same technological generation. In fact, with the above technique it is possible to store more than one data bit within the individual memory cell normally used to contain a single bit.

It is moreover known that, in order to read a two-level memory cell (containing 1 bit), an appropriate electrical quantity, correlated to the status of the cell, is compared with a reference value, and according to the outcome of the comparison it is determined whether the memory cell contains a logic "0" or a logic "1".

In the case of cells that can contain r bits, reading is carried out by comparing the electrical quantity correlated to the status of the memory cell with $2^r-1$ reference levels. The outcome of the comparisons makes it possible to determine in which of the $2^r$ intervals allowed the memory cell is found, and then to reconstruct the contents of the memory cell in terms of binary data.

The multilevel approach can be applied both to volatile memories (such as DRAMs) and to nonvolatile memories (such as EEPROM and Flash memories). In any case, the increase in the number of bits per cell renders tolerance to disturbance, retention of data, and accuracy of reading and writing operations more critical. In addition, the increase in the storage capacity demanded by the market tends to reduce the overall reliability. For these reasons, it is to be expected that the use of error-control codes will be of fundamental importance, above all in the case of high-capacity multilevel memories.

At present, the devices with the highest capacity present on the market store some hundred million bits, and the forecast for the next few years is for devices having increasingly higher capacities.

The increase in the number of cells tends to reduce the mean time to failure (MTTF) of the entire memory device. However, given the need to create increasingly more reliable equipment or systems, the level of reliability required for the individual memory component becomes increasingly more stringent. For this reason, dedicated design techniques are adopted, as well as a quality control on the production processes, in order to prevent or reduce failures.

However, malfunctionings of memory chips cannot be eliminated completely and can be reduced only at the expense of a reduction in performance or an increase in costs.

A very effective way for increasing reliability consists in designing error-immune memories using error-control codes, i.e., codes that are able to detect and correct errors in the data stored in the memories.

In particular, codes for the correction of a single error or for detection of a double error and correction of a single error are used in semiconductor memory devices of various types.

In particular, errors in memories are normally classified as "soft" errors and "hard" errors. By "soft" error is meant a random, non-repetitive. and non-permanent change in the status of a cell. Soft errors are caused by an occasional electrical noise or are induced by radiation (a particles, cosmic rays, etc.), regard a very limited number of cells each time, and can be recovered in the next writing cycle.

By "hard" error is instead meant a permanent physical failure associated to defects present in the device or arising during its operation on account of the incapacity of the materials to withstand the stresses applied. Generally speaking, hard errors are much rarer than soft errors.

Error-control codes enable a drastic reduction of the effects of soft errors, which represent the more serious problem, especially for multilevel memories. However, they may prove useful also for recovering some hard errors.

In order to protect the data that is to be stored in a memory, it is necessary to add, to the bits forming each data word, a certain number of control or parity bits, appropriately calculated. The operation that associates to each data word a precise value of the control bits is referred to as encoding. The control bits calculated by the circuit that carries out encoding must be stored together with the data word.

Each word stored will be subsequently read together with the control bits that belong to it. The decoding circuit is able to detect and correct a certain number of erroneous bits per word by appropriately comparing the value of the control bits with the value of the data bits.

The number of control bits that it is necessary to add to each data word is determined according to the length of the data word itself and to the number of errors per word that it is desired to correct.

More in general, error-control encoding may be extended from the binary alphabet (which contains only the two symbols "0" and "1") to a larger alphabet containing q symbols. In the latter case, encoding consists in adding a certain number of symbols (no longer bits) to each word to be stored, and the correction of the errors consists in correcting the erroneous symbols.

The aforesaid extension to the q-ary case is particularly suited to multilevel memories, in which each memory cell is able to store more than one bit (for instance, r bits). In this case, in fact, malfunctioning of a memory cell may degrade the values of all the bits stored therein. It is therefore more convenient to associate, to each block of r bits stored in a single cell, a q-ary symbol, i.e., a symbol belonging to an alphabet formed by $q=2^r$ distinct symbols. Each symbol is then stored in a distinct multilevel memory cell. In this way, each k-bit data word is viewed as a word formed by k/r q-ary symbols (corresponding to the number of memory cells that form each word), and correction of a symbol is equivalent to the correction of all the r bits associated thereto.

The error-control methods integrated in a semiconductor memory must meet three fundamental requirements:

the time required for the encoding operation and for the decoding operation (which comprises error detection and correction) must affect the memory access time only to a minimal extent;

the additional area due to the encoding and decoding circuit and to the control cells must be minimized; and the technique used must at least guarantee correction of any type of error on the individual cell, which, in the case of multilevel cells, may mean the error on a number of bits.

To prevent the times for encoding and decoding from degrading the access time, recourse may be typically had to the use of parallel-encoding structure or matrix-encoding structures, which enable the highest calculation speeds.

As regards, instead, the second requirement, the area is minimized by choosing codes with characteristics suitable for the particular application and appropriately optimized.

Finally, the last requirement is guaranteed by the use of q-ary codes, which enable detection and correction of errors on memory cells, irrespective of the number of erroneous bits associated to each of said cells.

Multilevel memories designed to store r bits per cell may, however, also operate with storage of a smaller number of bits per cell. In this case, for reading and writing it is possible to use a subset of the $2^r-1$ reference levels available. The extreme and simplest example of this operating condition is represented by the case in which a multilevel memory is used as a normal two-level memory.

The choice of reducing the number of bits stored in each cell reduces the storage capacity of the memory but increases its reliability. For example, in the case of nonvolatile memories, the reduction in the number of bits stored in each cell makes it possible to guarantee retention of the data for a longer time and in more unfavorable environmental conditions.

Normally, the choice of the operating mode is made in a permanent way by the producer. In particular, the choice of the operating mode may be advantageous for obtaining a memory with a smaller number of bits per cell as a subselection of a memory designed for storing a higher number of bits, in order to achieve an overall reduction in costs, or else this operating mode may be adopted either because there exists the need to obtain, from the same memory device, different sizes of memory, or else, more simply, for reasons of debugging of the memory device. In fact, when a first prototype of a new memory device is manufactured on silicon, it may be useful to have the possibility of switching to operating modes that are simpler than the normal ones in order to enable verification of the operation of the circuitry in circumstances that are less critical than the nominal ones.

Currently, moreover, in order to meet the growing demand of the market, memory devices are being designed in which also the end user can decide on the operating mode according to the type of use of the device, and consequently the need is increasingly felt of adopting a polyvalent error-control code that is able, using the same circuits, to protect the data stored in cells that operate at a different number of levels.

The aforesaid need is further strengthened by the fact that the memory devices of the next generations, with large storage capacities, will be able to be configured sector by sector and will thus have internal sectors set with a different number of bits (see, for example, the U.S. Pat. No. 5,574,879). It will be possible to use memory devices of this type, for instance, inside multimedia cards, so enabling storage, in sectors with a low number of bits per cell, of the microcode for the microprocessor that manages the card, and storage, in sectors with a high number of bits per cell, of the user data.

However, the error-control codes currently used in Flash memories are block codes implemented with CMOS logic networks, and their functionality is fixed once and for all in the design phase of the memory device. In fact, in the definition of this type of codes, the designer fixes once and for all some structural characteristics of the code which fix the limits of use thereof to the specific sphere for which the code is designed. In particular, during the code-design phase the choices are made as regards the number of bits on which the code is to operate, the error-correction capacity of the code, and the alphabet and the number of symbols of the alphabet with which to operate.

The number of parity bits required depends upon the above choices, and consequently it is evident that error-control codes that operate effectively in memory devices storing a given number of bits per cell are different from error-control codes designed to operate in memory devices storing a smaller number of bits per cell.

BRIEF SUMMARY OF THE INVENTION

Aspects of the present invention include a method of storage. The method includes providing an error-control code which operates, in the encoding phase, on b-bit binary strings formed by k data symbols of a number, r, bits each; selecting a number, s, of bits that each of a plurality of multilevel memory cells are to store; and if the number s is smaller than the number r, then forming one of the data symbols with the s number of data bits in one of the memory cells and with r-s bits each having a given logic value.

In accordance with another aspect of the invention, the method includes arranging the r-s bits having a given logic value in a most significant part of the data symbol or arranging the r-s bits having a given logic value in a least significant part of the data symbol.

Yet another aspect includes forming one of the data symbols with the data bits stored only in one of the memory cells when the number s of bits is selected to equal the number r of bits.

BRIEF DESCRIPTION OF THE SEVERAL VIEWS OF THE DRAWING(S)

For a better understanding of the present invention, a preferred embodiment thereof is now described, purely by way of non-limiting example, with reference to the attached drawings, in which.

Figure 5:
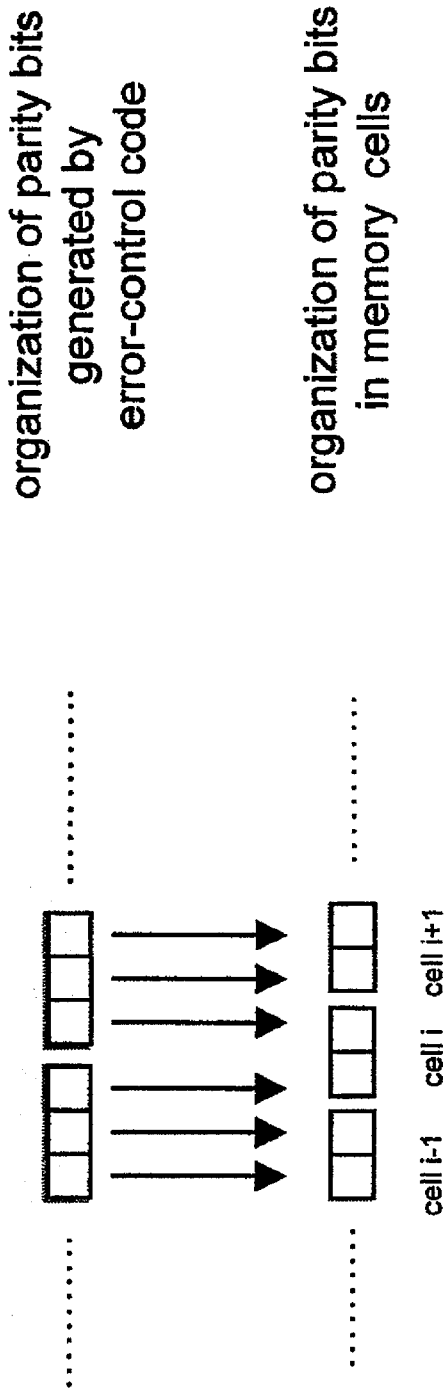
Figure 6:
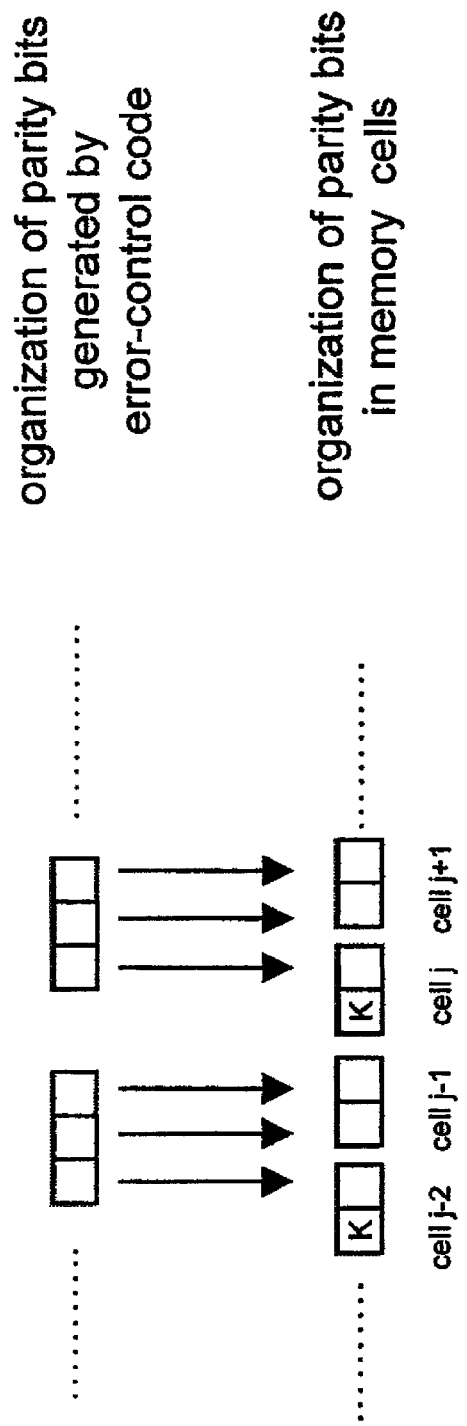

FIG. 5 shows the organization of the parity bits generated by the error-control code, the organization of the parity bits in two-bit memory cells, and an erroneous storage of the parity bits in the two-bit memory cells; and FIG. 6 illustrates the organization of the parity bits generated by the error-control code, the organization of the parity bits in two-bit memory cells, and a correct storage of the parity bits in the two-bit memory cells.

DETAILED DESCRIPTION OF THE INVENTION

The disclosed embodiments of the present invention provide a method that enables use of the same error-control code designed to operate on memory cells storing a given number of bits per cell even when these memory cells store a smaller number of bits per cell. A method for error control in multilevel memory cells storing a configurable number of bits is therefore disclosed herein.

In order to facilitate understanding of the present invention, some notation will be introduced hereinafter regarding the linear block encoding used for detecting and correcting errors in multilevel memories. For a more detailed treatment of the subject, see, for example, W. W. Peterson, E. J. Weldon, *Error-Correcting Codes*, $2^{nd}$ ed., M.I.T. Press, Cambridge (Mass.), 1972, and R. E. Blahut, *Theory and Practice of Error Control Codes*, Addison-Wesley, Reading (Mass.), 1983.

In particular, we shall define as q-ary symbols the elements of an alphabet containing q distinct symbols, and we shall define as data word the vector of k q-ary symbols that are to be written in the memory, indicating the data word as follows:

i=(i1, i2, . . . , ik)

In linear block encoding, the data word is mapped biuniquely in a vector of n q-ary symbols (with n>k), which we shall define as codeword, indicating it as follows:

$\underline{c}$=($c_1, c_2, \ldots, c_n$)

The encoding operation can be described in algebraic form by introducing the matrix G, referred to as code generating matrix (see in this connection W. W. Peterson, E. J. Weldon, *Error-Correcting Codes*, $2^{nd}$ ed., M.I.T. Press, Cambridge (Mass.), 1983).

Each codeword $\underline{c}$ can be generated simply by multiplying the data word by the generating matrix, as expressed in the following equation:

$\underline{c}=\underline{i}\cdot G$ where i and c are row vectors.

The generating matrix G is a rectangular matrix with k rows and n columns and rank k (for the application $\underline{i}\to\underline{c}$ to be injective).

For each linear code (n, k) there exists a matrix H, referred to as parity-control matrix (see the above-mentioned text *Error-Correcting Codes*) having n-k rows and n columns, such that $G\cdot{}^tH=0$ where 0 indicates the matrix k×(n−k) with all zero elements, and ${}^tH$ indicates the transpose of the matrix H.

The n−k symbols added during encoding are referred to as parity symbols or control symbols.

We shall define as q-ary code (n, k) the set of the $q^k$ codewords obtained from the encoding of all the possible data words, and we shall define as correction capacity of the q-ary (n, k) code the number t of errors (i.e., of erroneous q-ary symbols) per word that the code is able to correct.

The following inequality, known as Hamming limit (see the aforementioned text *Error-Correcting Codes*), yields the minimum number of parity symbols required for the q-ary (n, k) linear code to have correction capacity t:

$$q^{n-k} \geq \sum_{i=0}^{t}\binom{n}{i}(q-1)^i \tag{1}$$

In the light of the above notation and with the sole aim of facilitating understanding of the present invention, described hereinafter will be the application of the method according to the present invention to a specific example, and subsequently the applicability of the invention to the general case will be illustrated.

In particular, described hereinafter will be the method that enables use of an error-control code designed to operate effectively on memory cells storing 3 bits per cell even when the said memory cells are used for storing just 2 bits per cell.

Consider moreover the case of an error-control code which operates on 256-bit data words that are formed by three-bit symbols, and which is able to detect and correct at the most the errors caused by malfunctioning of one and the same memory cell, i.e., the error of a single bit, the error of 2 bits, and the error of 3 bits that can be attributed to said memory cell (t=1).

In the case considered, an optimal solution is to provide an error-control code on a vector space $GF(2^3)$, namely a Galois vector space in which the possible symbols of the alphabet are eight, as are the distributions stored in a single memory cell.

For a detailed treatment of the subject, see, for instance, the aforementioned *Theory and Practice of Error Control Codes*.

Figure 1:
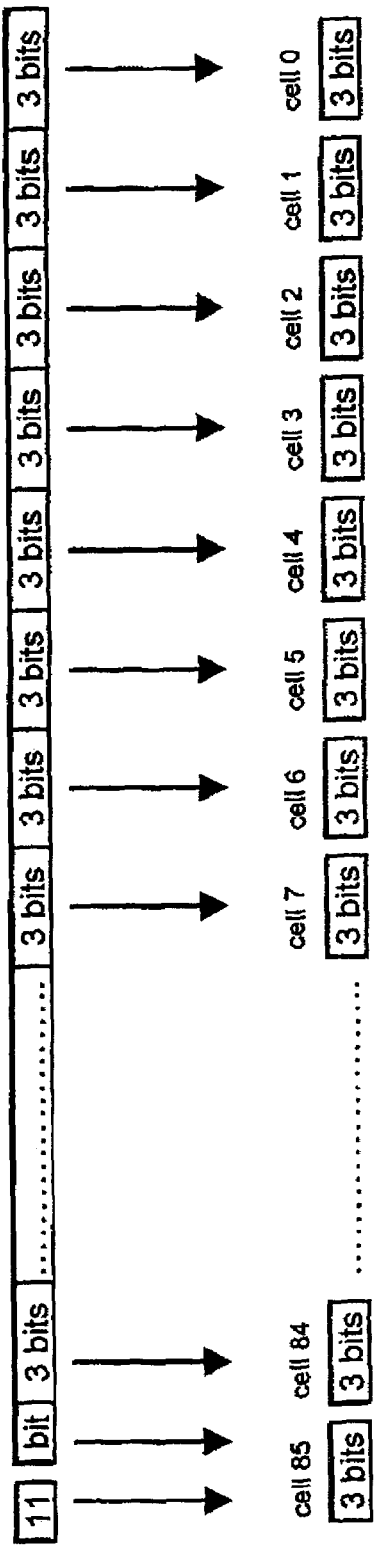
FIG. 1 illustrates the organization of the bits of a string on which there acts an error-control code that operates on three-bit symbols and the association of the bits to three-bit memory cells.

FIG. 1 illustrates the organization of the bits of the string on which the aforesaid error-control code operates, and the association of said bits to three-bit memory cells.

In particular, as illustrated in FIG. 1, the 256 bits of the data word are stored in 86 three-bit memory cells. One of the 86 memory cells is partially used and contains 2 bits fixed at the logic value "11" and one bit of the data word.

If we suppose that for the application for which the code is intended for it is sufficient to correct a single error per data word (t=1), to the 86 memory cells that contain the data word the code adds five parity symbols of 3 bits each, for a total of 15 bits, which are stored in five memory cells. This number is fixed by the Hamming inequality referred to previously, in which q=8 (number of symbols of the alphabet), k=86 (number of symbols of the data word), n=91 (sum of the number of symbols of the data word and of the number of parity symbols), and t=1 (number of erroneous symbols that it is intended to correct).

Suppose now that the storage device switches from a three-bit-per-cell storage mode to a two-bit-per-cell storage mode.

In the latter different storage mode, the 86 memory cells can thus contain at most 172 bits. It is, however, convenient to obtain that the number of bits contained in the memory cells is a power of two in order to avoid complicated modifications to the addressing of the memory cells. By so doing, in fact, addressing remains practically unaltered, in so far as it is sufficient simply to eliminate the least significant bit of the addresses, thus returning to a situation in which the number of bits stored in the memory cells is a power of two.

In order to do this, then, in the two-bit-per-cell storage mode it is expedient that in the 86 memory cells there should be stored only 128 bits, instead of 172. Storage of 128 bits requires, however, only 64 memory cells, and consequently 22 of the 86 available cells remain unused.

The logic network that implements the error-correction code operates, however, in all cases on a 256-bit binary string and generates 15 control bits.

The idea to enable even so the use of the error-control code that is already present is therefore to supply to the encoding circuitry a 256-bit binary string formed by a data portion proper consisting of the 128 bits stored in the 64 memory cells and constituting the data word proper, and by a constant portion made up of bits each having a given or constant logic value.

The addition of the bits having a constant value to the data word must be done carefully, taking into account how the error-control code operates and how the bits are stored in the memory cells.

Figure 2:
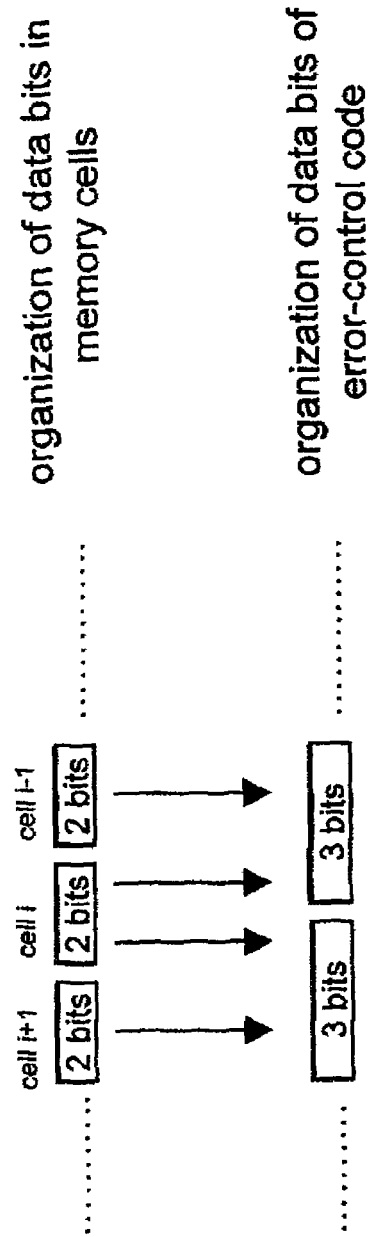
FIG. 2 shows the organization of the bits of a data word that are stored in two-bit memory cells, the organization of the bits of a string on which there acts an error-control code that operates on three-bit symbols, and an incorrect association between the bits of the data word and the bits of the symbols on which the error-control code operates.

In particular, as has been illustrated previously, the error-control code is devised for operating on three-bit symbols, and consequently it would be wrong to generate the 256-bit binary string in the way shown in FIG. 2, which illustrates the organization of the bits of the data word that are stored in two-bit memory cells, and the organization of the bits of the string on which the error-control code acts.

In particular, as shown in FIG. 2, it would be wrong to associate simply the stored data portion proper (data word proper) to the least significant part or to the most significant part of the 256-bit string on which the error-control code operates, because there might arise incorrect situations in which errors caused by malfunctioning of one and the same memory cell may form part of two different symbols.

In fact, if the association shown schematically in FIG. 2 were to be made, an error attributable to the i-th cell that involves both of the bits contained in the cell would not be corrected by the error-control code in so far as the code is designed for correcting one or more errors forming part of one and the same set of three bits corresponding to a single memory cell.

Figures 3, 4:
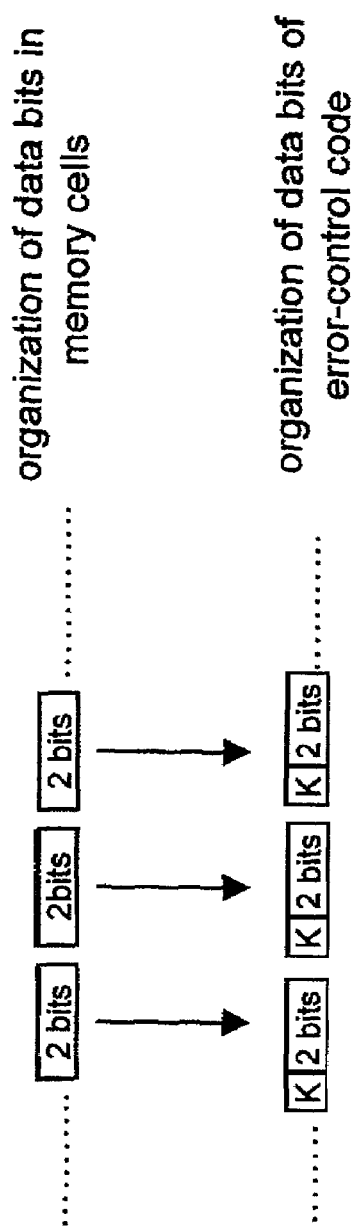
FIG. 3 shows the organization of the bits of a data word that are stored in two-bit memory cells, the organization of the bits of a string on which there acts an error-control code that operates on three-bit symbols, and a correct association between the bits of the data word and the bits of the symbols on which the error-control code operates.
FIG. 4 shows a binary string according to the present invention which is obtained starting from the bits of a data word that are stored in two-bit memory cells and upon which there acts an error-control code that operates on three-bit symbols.

The association between the bits of the data word and the bits of the symbols on which the error-control code acts that enables avoidance of the above-described problem is, instead, shown schematically in FIG. 3 and consists in adding one bit having a constant logic value to each pair of bits of the data word stored in a two-bit memory cell.

In other words, the most significant or least significant part of a three-bit symbol is constituted by the pair of bits stored in the two-bit memory cell, whilst the remaining part of the symbol is constituted by a bit having a constant logic value.

Using the above procedure, the aforesaid drawback is prevented in so far as the correction capacity of the code, which operates on three adjacent errors, is associated to a single memory cell.

It is evident that in the memory array there are stored only the data bits, and not the bits added in order to enable calculation of the parity bits.

The association illustrated above does not, however, yet lead to the formation of a 256-bit binary string, and consequently, in addition to the sub-string obtained by inserting a bit having a constant logic value after each pair of bits of the data word, it is expedient to insert in the 256-bit binary string, in the most significant or least significant part thereof, an additional sub-string of bits having a constant logic value.

In particular, in the example considered, in order to supply to the error-control code a 256-bit string, it is necessary to add 22·3=66 bits having a constant logic value. In this way, the binary string shown in FIG. 4 is obtained, in which the 66 bits are denoted by K and have been inserted in the most significant part of the string.

The logic value K to be associated to the constant bits is linked to the convention that imposes that the memory cells after an erasure should be all considered at a logic level "1", including the memory cells in which the parity bits are stored. In fact, given that the erasure operation involves without distinction both the memory cells in which the bits of the data word are stored and the memory cells in which the parity bits are stored, the error-control code must associate, to the data word formed by bits all having logic value "1", parity bits all having logic value "1", in order to prevent situations of inconsistency after an erasure step.

To enable use of the error-control code already present even when the storage mode of the memory device is changed from three bits per cell to two bits per cell, also storage of the parity bits generated by the error-control code (which are 15 in all cases) calls for appropriate management.

In particular, the five memory cells that during the three-bit-per-cell storage mode had the function of storing the 15 parity bits, clearly become insufficient in the two-bit-per-cell storage mode. In fact, it is necessary to store 15 bits, whereas the five-memory cell can, in the latter mode, store only 10 bits.

To overcome the above problem, it is possible to use part of the 22 memory cells which, in switching from the three-bit-per-cell storage mode to the two-bit-per-cell storage mode, have become overabundant.

Also in this case, attention must be paid to how the parity bits are associated to the memory cells. In fact, each set of three parity bits must be independent of the remaining sets, and consequently it is not possible to make an association like the one illustrated in FIG. 5, which shows the organization of the parity bits generated by the error-control code and the organization of the parity bits in two-bit memory cells.

In particular, as shown in FIG. 5, it would be wrong to store two bits of a symbol in a given memory cell and the third bit of the same symbol in a different memory cell, in so far as this association could cause an error in the parity cell i involving both of the bits stored in said cell to result in the error-control code carrying out a correction in this position or in another position in an uncontrolled way because the error is beyond the correction capacity of the code (it is recalled in fact that one of the assumptions underlying the present invention is that the error-control code should be able to detect and correct errors that may be put down to malfunctioning of a single memory cell).

In order to prevent the above problem, the three bits of a symbol must not be stored in memory cells shared by the bits of other symbols.

An effective association is, for example, the one illustrated in FIG. 6, in which two bits of a symbol are stored in a given memory cell, whilst the third bit of the same symbol is stored in a different memory cell, in which there is then not stored a bit of another symbol, but rather a bit having a constant logic value.

The above association prevents the problems referred to above and enables an error that occurs on the cell j to be recovered by the error-control code. With this association, every error that occurs on a cell can be corrected by the error-control code without having to modify the logic network that implements the code.

The inventive principle described above with reference to switching from a three-bit-per-cell storage mode to a twobit-per-cell storage mode can then be generalized also to switching from an r-bit-per-cell storage mode to an s-bit-per-cell storage mode.

In this general case, the error-control code operates on a vector space $GF(2^r)$, namely a Galois vector space in which the possible q-ary symbols are $2^r$, and on a string of b bits, whereas the p parity bits generated by the encoding operation can be calculated using the Hamming inequality referred to previously.

In particular, when the s-bit-per-cell storage mode is adopted, given that the error-control-code is designed to operate on r-bit symbols, each of the symbols must be formed by the s bits stored in a memory cell, to which there are added r-s symbols having a pre-determined logic value. The s bits stored in a memory cell are arranged in the least significant part, whereas the r-s bits having a pre-determined logic value are arranged in the most significant part.

In addition, given that the error-control code is designed for operating on a b-bit string, in the most significant or least significant part of the string there must be inserted an additional set of bits having a pre-determined logic value in a sufficient number to bring the length of the string up to b bits.

Of the k memory cells which in the r-bit-per-cell storage mode contained the bits of the data word, in the s-bit-per-cell storage mode a number m of said memory cells will be used for storing the data bits, whilst the remaining cells can be used for storing some of the p=n−k parity bits that cannot be stored in the memory cells which in the r-bit-per-cell storage mode were able to contain all the p parity bits.

In addition, in the s-bit-per-cell storage mode, storage of the p parity bits is carried out in a way similar to the one described previously, namely by causing two parity symbols not to share any memory cell, namely by causing each r-bit symbol to be stored in a set of memory cells distinct from the sets of memory cells used for storing the other r-bit symbols. In particular, storage of a group of r bits will fill completely r/s memory cells, whilst the remaining $R\{r/s\}$ bits, where $R\{r/s\}$ stands for the remainder of the division r/s, are stored in another memory cell together with $s-R\{r/s\}$ constant bits.

The advantages that the embodiments of the present invention makes it possible to achieve emerge clearly from an examination of its characteristics.

Finally, it is clear that modifications and variations may be made to what is described and illustrated herein, without departing from the sphere of protection of the present invention as defined in the attached claims.

In particular, it is emphasized that, as in the case of the formation of the binary string on which the error-control code operates, the set of bits having a constant logic value can be indifferently inserted either in the most significant part or in the least significant part of the binary string. Likewise, in the formation of a data symbol in the s-bit-per-cell storage mode, the bits having a constant value that are added to the s bits stored in each memory cell may be indifferently inserted either in the most significant part or in the least significant part of the data symbol.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method for error-control in multilevel memory cells storing a configurable number of data bits, said error-control method comprising:
    using an error-control code which operates, in an encoding phase, on b-bit binary strings formed by k data symbols of r data bits each; and
    when said multilevel memory cells store a number s of data bits smaller than r, using the error-control code which operates, in the encoding phase, on the b-bit binary strings formed by the k data symbols of s data bits each, at least one of said k data symbols being formed with the s data bits and with r-s bits, each of the r-s bits having a given logic value.

2. The error-control method according to claim 1 wherein said r-s bits having a given logic value are arranged in the most significant part of the at least one of said k data symbols.

3. The error-control method according to claim 1 wherein said r-s bits having a given logic value are arranged in the least significant part of the at least one of said k data symbols.

4. The error-control method according to claim 1 wherein when said multilevel memory cells store r data bits, at least one of said k data symbols of r data bits each is formed only with the r data bits stored in one said multilevel memory cell.

5. The error-control method according to claim 1 wherein the given logic value of each of the r-s bits added to the s data bits for the formation of the at least one of said k data symbols is based upon each multilevel memory cells storing a logic value "1" after an erasure step.

6. The error-control method according to claim 1, further comprising:
    storing each of said binary strings using k multilevel memory cells, each memory cell of the k multilevel memory cells configured to store the r data bits; and
    when each memory cell of the said k multilevel memory cells are configured to store the s data bits, dividing the k multilevel memory cells into a first subset of memory cells in which m data bits are stored and a second subset of memory cells that are not used for storing data bits, the m data bits equal to a power of two.

7. The error-control method according to claim 6 wherein when said first subset of memory cells store the m data bits equal to a power of two, one said b-bit binary string is formed using a further set of bits each having a given logic value.

8. The error-control method according to claim 7 wherein said further set of bits having a given logic value is arranged in the most significant part of the binary string.

9. The error-control method according to claim 7 wherein said further set of bits having a given logic value is arranged in the least significant part of the binary string.

10. The error-control method according to claim 6, further comprising:
    a set of p r-bit parity symbols; and
    when each memory cell of said k multilevel memory cells store s data bits, the bits of each parity symbol of the p parity symbols are stored in a set of memory cells distinct from the k multilevel memory cells.

11. The error-control method according to claim 10 wherein at least some of the bits of said parity symbols are stored in the second subset of said k multilevel memory cells.

12. The error-control method according to claim 1, further comprising:
   storing parity bits in the multilevel memory cells, the parity bits associated by the error-control code to a data word to be encoded; and
   setting the parity bits to a logical value "1" when the data word to be encoded is formed by bits all having the logic value "1."

13. A method of storage comprising:
   providing an error-control code which operates, in the encoding phase, on b-bit binary strings formed by k data symbols of a number, r, bits each;
   selecting a number, s, of data bits that each of a plurality of multilevel memory cells are to store;
   if the numbers is smaller than the number r, then forming one of the data symbols with the s number of data bits in one of the memory cells and with r-s bits each having a given logic value; and
   using the error-control code which operates, in the encoding phase, on b-bit binary strings formed by k data symbols of s data bits each.

14. The method of claim 13 including arranging the r-s bits having a given logic value in a most significant part of the data symbol.

15. The method of claim 13 including arranging the r-s bits having a given logic value in a least significant part of the data symbol.

16. The method of claim 13 including forming one of the data symbols with the data bits stored only in one of the memory cells when the number s of bits is selected to equal the number r of bits.

17. The method of claim 13 including:
   determining the given logic value of each of the bits added to the data bits for the formation of the data symbol based upon each memory cell storing a logic value "1" after an erasure step; and
   for the memory cells storing parity bits associated by the error-control code to a data word being encoded, associating to the parity bits a logic value "1" when the data word being encoded is formed by bits all having the logic value "1".

18. The method of claim 13 including:
   storing each of said binary strings using k multilevel memory cells when the number s of bits is selected to equal the number r of bits; and
   storing in said k multilevel memory cells only a number m of data bits equal to a power of two when the number s of bits is selected to be smaller than the number r of bits such that the k multilevel memory cells are divided into a first subset of memory cells containing the m data bits and a second subset of memory cells containing other than data bits.

19. The method of claim 18 including forming one said b-bit binary string using a further set of bits each having a given logic value when the number s of bits is selected to be smaller than the number r of bits.

20. The method of claim 19 including arranging the further set of bits having a given logic value in a most significant part of the binary string.

21. The method of claim 19 including arranging the further set of bits having a given logic value in a least significant part of the binary string.

22. The method of claim 18 including:
   supplying a first set of p r-bit parity symbols from the error-control code; and
   storing the bits of each parity symbol in a set of memory cells distinct from sets of memory cells used for storing bits of parity symbols other than the first subset, when the number s of bits is selected to be smaller than the number r of bits.

23. The method of claim 22 including storing at least some of the bits of the first set of parity symbols in the second subset of memory cells.

24. A system for storage comprising:
   means for providing an error-control code which operates, in the encoding phase, on b-bit binary strings formed by k data symbols of a number, r, bits each;
   means for selecting a number, s, of data bits that each of a plurality of multilevel memory cells are to store;
   means for forming one of the data symbols with the s number of data bits in one of the memory cells and with r-s bits each having a given logic value if the number s is smaller than the number r; and
   means for using the error-control code which operates, in the encoding phase, on b-bit binary strings formed by k data symbols of s data bits each.

25. The system of claim 24 including means for arranging the r-s bits having a given logic value in a most significant part of a data symbol of the k data symbols.

* * * * *

UNITED STATES PATENT AND TRADEMARK OFFICE
CERTIFICATE OF CORRECTION

PATENT NO. : 7,017,099 B2 Page 1 of 1
APPLICATION NO. : 10/159782
DATED : March 21, 2006
INVENTOR(S) : Rino Micheloni et al.

It is certified that error appears in the above-identified patent and that said Letters Patent is hereby corrected as shown below:

Title Page
Item (73), Assignee, should read as --STMicroelectronics S.r.l., Agrate Brianza (IT)--.

Column 10
Line 32, "...based upon each multilevel memory cells storing..." should read as
--... based upon each multilevel memory cell storing…--.

Line 59, "...a set of $p$ $r$-bit parity symbols..." should read as --...supplying a set of $p$ $r$-bit parity symbols…--.

Column 11
Line 15, "...if the numbers is smaller than the number $r$..." should read as --...if the Number $s$ is smaller than the number $r$…--.

Signed and Sealed this

Twenty-first Day of August, 2007

JON W. DUDAS
*Director of the United States Patent and Trademark Office*